(12) United States Patent
Plavec et al.

(10) Patent No.: US 9,058,862 B2
(45) Date of Patent: Jun. 16, 2015

(54) VOLTAGE REGULATOR

(71) Applicant: EM Microelectronic-Marin SA, Marin (CH)

(72) Inventors: Lubomir Plavec, Brno (CZ); Filippo Marinelli, Lussy-sur-Morges (CH)

(73) Assignee: EM Microelectronic-Marin S.A., Marin (CH)

( * ) Notice: Subject to any disclaimer, the term of this patent is extended or adjusted under 35 U.S.C. 154(b) by 0 days.

(21) Appl. No.: 14/279,486

(22) Filed: May 16, 2014

(65) Prior Publication Data

US 2014/0347946 A1    Nov. 27, 2014

(30) Foreign Application Priority Data

May 24, 2013  (EP) .................................. 13169153

(51) Int. Cl.
*G11C 5/14* (2006.01)
*H02M 3/07* (2006.01)
*H02M 3/04* (2006.01)

(52) U.S. Cl.
CPC ............... *G11C 5/147* (2013.01); *G11C 5/145* (2013.01); *H02M 3/07* (2013.01); *H02M 3/04* (2013.01)

(58) Field of Classification Search
CPC ........ G11C 5/147; H02M 3/156; H02M 3/18; H02M 3/04
USPC .................... 365/226, 229, 228; 323/234, 304
See application file for complete search history.

(56) References Cited

U.S. PATENT DOCUMENTS

| | | | |
|---|---|---|---|
| 5,835,420 A * | 11/1998 | Lee et al. ................ | 365/189.09 |
| 6,515,903 B1 | 2/2003 | Le et al. | |
| 8,058,910 B1 * | 11/2011 | Wright ......................... | 327/143 |
| 2009/0059629 A1 * | 3/2009 | Wang et al. .................... | 363/60 |
| 2009/0172242 A1 * | 7/2009 | Piasecki ....................... | 710/317 |
| 2010/0245286 A1 * | 9/2010 | Parker .......................... | 345/174 |
| 2013/0015831 A1 * | 1/2013 | Wong et al. ................... | 323/282 |

OTHER PUBLICATIONS

European Search Report issued Feb. 25, 2014 in EP Application 13169153, filed on May 24, 2013.
Marco Bucci et al. "A Low Leakage Non-Volatile Memory Voltage Pulse Generator for RFID Applications", Design and Diagnostics of Electronic Circuits and Systems, 2008, 4 pages.

* cited by examiner

*Primary Examiner* — Viet Q Nguyen
(74) *Attorney, Agent, or Firm* — Oblon, McClelland, Maier & Neustadt, L.L.P.

(57) ABSTRACT

The present invention relates to a voltage regulator and to a method of operating a voltage regulator that is operable in a reset mode and in a sampling mode. The voltage regulator comprises a capacitive voltage divider having a first capacitor and a second capacitor in series with the first capacitor, wherein the capacitive voltage divider is connectable to an output of a voltage supply to activate the sampling mode, a comparator having an output connected to an input of the voltage supply, the comparator further having a first input connected to a sampling node arranged between the first capacitor and the second capacitor and the comparator having a second input connected to a reference voltage, wherein the sampling node is connectable to the reference voltage for activating the reset mode.

11 Claims, 2 Drawing Sheets

VOLTAGE REGULATOR

This application claims priority from European Patent Application No. 13169153.7 filed 24 May 2013, the entire disclosure of which is incorporated herein by reference.

FIELD OF THE INVENTION

The present invention relates to the field of voltage regulators for use in integrated circuits and in particular to voltage regulators for a charge pump to enable operation of a memory unit.

BACKGROUND AND PRIOR ART

In applications with non-volatile memory units charge pumps are typically used to provide a stable high-voltage level that is required to enable writing—or erasing—operations of the memory unit. For supplying a stable and constant voltage level, such charge pumps typically require regulation. In the absence of effective regulation the charge pump's output voltage may vary depending upon environmental conditions, electric load and the processing parameters under which the charge pump was fabricated. Among a variety of regulating circuits capacitive dividers are widely used, by way of which a high voltage level on the output of the charge pump can be sensed in the absence of any static current load. The capacitive divider is operable to divide the high voltage to levels which can be processed by a regulation or feedback loop that is typically operable to compare the downscaled voltage with a reference voltage.

In FIG. 1 a voltage regulator 1 with a capacitive divider 2 as it is widely known in the prior art is illustrated. Between the two capacitors 4, 6 of the capacitive divider 2 there is provided a sampling node 8 that forms an output 5 of the voltage regulator 1. Said output 5 is connected to an input of a comparator (not illustrated) to compare the voltage level of the sampling node 8 with a given reference voltage. Depending on this comparison, a voltage supply, typically in form of a charge pump is driven by the comparator to either increase or to decrease the voltage at the high voltage output 7.

At the beginning of a sampling operation the voltage regulator 1 needs to be initialized to start from well-defined conditions. For activating a reset mode, a switch 3 is closed while the capacitive voltage divider 2 is de-connected from the high voltage output 7. When operating the voltage regulator 1 in a sampling mode, the switch 3 is disconnected but since there is an inevitable current leakage across the switch 3, the voltage on the sampling node 8 will be influenced and may cause a drift of the output voltage as the voltage regulator 1.

This drawback is also described in US 2009/0059629 A1. There, a separate reset circuit is provided designed to reduce sample drift by reducing charge leakage from the sampling node.

Moreover, such voltage regulators 1 further comprise an inevitable parasitic capacitance on the output of the divider 2 that may vary with time, external or environmental conditions as well as with the electrical parameters at which the voltage regulator 1 is driven. The parasitic capacitance 9 may effectively vary the ratio of the capacitance of first and second capacitors 4, 6, thereby modifying the division ratio of the capacitive divider 2.

Generally, by increasing the capacitance of first and second capacitors 4, 6, the influence of a parasitic capacitance 9 may be reduced at the expense of comparatively large, bulky and expensive first and second capacitors 4, 6.

SUMMARY OF THE INVENTION

It is therefore an object of the present invention to provide an improved voltage regulator for regulating the output voltage of a voltage supply, such as a charge pump, wherein influences of current leakage or parasitic capacitors are effectively reduced or completely annihilated. It is a further aim to provide a rather compact and cost-efficient voltage regulator that can be implemented with a capacitive voltage divider featuring comparatively small sized capacitors.

Moreover, the voltage regulator should further provide a long term, stable and precise high voltage output level substantially free of voltage drift.

In a first aspect a voltage regulator operable in a reset mode and in a sampling mode is provided. The voltage regulator comprises a capacitive voltage divider having a first capacitor and a second capacitor. First and second capacitors are arranged in series and the capacitive voltage divider is connectable to an output of a voltage supply to activate the sampling mode. Typically, the capacitive voltage divider is connectable to an output of a charge pump during sampling for adjusting the high voltage output level of the charge pump to a predefined level.

The voltage regulator further comprises a comparator having an output connected to an input of the voltage supply. Said comparator further has a first input connected to a sampling node and further has a second input connected to a reference voltage. The sampling node is arranged between the first capacitor and the second capacitor. Since the sampling node between first and second capacitors is connected to the comparator, the voltage at the sampling node can be compared with the provided reference voltage.

If the voltage of the sampling node is below the reference voltage, the comparator is operable to generate an incrementing input signal for the voltage supply to increase the output voltage. In different situations, wherein the voltage of the sampling node is above the reference voltage, the comparator is operable to generate a decrementing input signal for the voltage supply to decrease the output voltage. Hence, capacitive voltage divider, comparator and voltage supply are arranged in a kind of a control or feedback loop.

The voltage regulator is operable in a reset mode, in which the input of the comparator can be set to a predefined value in order to start the subsequent sampling mode from well-defined starting conditions. Here, the sampling node is connectable to the reference voltage for activating said reset mode. In reset mode, the sampling node is therefore set to the reference voltage, so that first and second inputs of the comparator are substantially at the same voltage level. When switching the voltage regulator into sampling mode, the sampling node may substantially remain at the reference voltage level during the entire sampling operation.

By disabling the reset mode and simultaneously enabling or activating the sampling mode, the sampling node is disconnected from the reference voltage while the voltage divider is connected to the output of the voltage supply. Apart from transient voltage peaks or drops the voltage level of the sampling node will be kept at the reference voltage level due to the regulation implemented by the comparator and the voltage supply connected therewith. By connecting the sampling mode to the reference voltage during the reset operation of the voltage regulator the sampling node is also driven at the reference voltage level during a subsequent sampling mode.

Driving the sampling node at or close to the reference voltage even during sampling or regulation of the output of the voltage supply, any drawbacks, such like a drift of the output voltage due to a current leakage can be minimized or even completely annihilated. Voltage drop across a switch for connecting the sampling node to the reference voltage during reset may substantially equal zero or may be at a negligible level.

Moreover, by connecting the sampling node during reset to the reference voltage allows to keep the sampling node also during a subsequent sampling procedure to a constant reference voltage level. In this way, also an impact of any parasitic capacitance can be reduced since the output of the capacitive voltage divider is at least the same at the beginning and at the end of a sampling operation. Since the capacitive voltage divider has substantially the same output during initialization in a reset mode and during operation in a sampling mode any negative impact of a parasitic capacitance can be effectively minimized or even completely removed.

According to an embodiment, the sampling node is disconnectable from the reference voltage to activate the sampling mode. Since the sampling node is initially set to the reference voltage, the feedback or regulation loop tends to modify the output of the voltage supply in such a way that the voltage of the sampling node always equals the reference voltage at the second input of the comparator.

At the same time and according to a further embodiment, the first capacitor of the capacitive voltage divider is connectable to the output of the voltage supply via a first switch. For transferring the voltage regulator from the reset mode into the sampling mode, the sampling node is disconnected from the reference voltage while at the same time the first capacitor of the capacitive voltage divider is connected to the output of the voltage supply. Transferring the voltage regulator from the sampling or operation mode into the reset mode requires an opposite configuration. Then, the sampling node is reconnected to the reference voltage while the first capacitor is simultaneously disconnected from the output of the voltage supply.

Accordingly and following a further embodiment, the capacitive voltage divider and/or its first capacitor is or are disconnectable from the output of the voltage supply to activate the reset mode. Typically, during the reset mode, the first and second capacitors are charged with the reference voltage. For this, first and second capacitors are both connected to the reference voltage. When switching the voltage regulator from reset mode into sampling mode, first and second capacitors are disconnected from the reference voltage. Then, the two capacitors of the capacitive voltage divider are connected in series with the output of the voltage supply, i.e. with the output of the charge pump.

According to a further embodiment, the second capacitor is connected to ground via a driving circuit. In this way, a voltage drop across the second capacitor can be controlled and modified during operation of the voltage regulator in the sampling mode. Adapted to the temporal behavior of the feedback or regulation loop, the voltage level provided by the second capacitor can be ramped down to ground so that the voltage level of the sampling node may remain substantially constant at the reference voltage level. In a simple embodiment the driving circuit may comprise another switch, by way of which the second capacitor can be selectively disconnected and connected from and to ground.

Typically, when operated in reset mode, the second capacitor is disconnected from ground while it is connected to ground at least after a steady state operation of the voltage regulator has been reached when driven in sampling mode. In other embodiments the driving circuit may be operable to generate a controlled ramp voltage to define a rise time of the output of the voltage supply.

According to a further embodiment, a first node is provided between the first capacitor and the output of the voltage supply, wherein said first node is connectable to the reference voltage via a second switch. Typically, said first node is also located between the first capacitor and the first switch, by way of which the first capacitor is connectable to the output of the voltage supply.

According to another embodiment, the sample node is connectable with the reference voltage via a third switch. By opening and closing the third switch, the sample node can be selectively connected to the reference voltage. Typically, in reset mode, the third switch is closed or connected while it is open or disconnected in sampling or operation mode. Especially when in sampling mode, the third switch experiences no substantial voltage drop since it is connected with the sampling node driven at reference voltage and it is further connected to the reference voltage itself. In this way the opened or disconnected switch is connected to the reference voltage to both sides.

According to another embodiment, a second node is arranged between the second capacitor and the driving circuit. In this way, operation of the driving circuit may lead to varying voltage levels at the second node, which has a direct influence on the voltage drop across the second capacitor and hence across the first capacitor.

Moreover and according to another embodiment, also the second node is connectable to the reference voltage via a fourth switch. By implementing a series of switches, in particular by arranging second, third and fourth switches in parallel, the first and second capacitors of the capacitive voltage divider can be selectively charged with the reference voltage when in reset mode. Typically, second, third and fourth switches are to be operated simultaneously. While second, third and fourth switches are typically open or disconnected during sampling mode they are closed or connected for driving the voltage regulator in reset mode.

Typically, second, third and fourth switches are closable while the first switch is openable for activating the reset mode. Here, closing of second, third and fourth switches may take place simultaneously with opening of the first switch.

In another embodiment, second, third and fourth switches are openable while the first switch is closable for activating the sampling mode. Also here, second, third and fourth switches are simultaneously switchable with the first switch for transferring the voltage regulator from the reset mode into the operation or sampling mode.

According to a further embodiment, the driving circuit is operable to decrement the voltage of the second node in a controlled way towards ground voltage level. The driving circuit is particularly configured to ramp down the voltage of the second node in accordance to a predefined schedule. Decrementing the voltage of the second node leads to a respective increase of the voltage of the first node since the voltage of the sampling node located therebetween is kept substantially constant by means of the comparator and the voltage supply.

In this way, ramping down of the voltage of the second node by means of the driving circuit leads to a ramp up of the voltage of the first node and hence to a ramp up of the output voltage of the voltage supply. The driving circuit can be implemented in a variety of different ways. For instance, the driving circuit may comprise a controllable voltage or current supply. Moreover, it may comprise a counter coupled with a digital-analogue converter, which allows to connect the second capacitor to ground after the voltage regulator is operated in sampling mode for a predefined period of time.

By means of the driving circuit, acting as a bottom driver in series with the second capacitor, the output of the voltage supply and hence the voltage at the first node can be ramped up to a predefined high voltage output level since the sampling node is almost constantly kept at the reference voltage during this sampling procedure. In effect, during operation of the voltage regulator there is no specific change in voltage on any parasitic capacitors. The impact of such inevitable parasitic capacitance is therefore reduced to a minimum, hence to a negligible level.

According to another embodiment, the voltage supply, the voltage supply output, the first capacitor, the sample node and the comparator form a feedback or regulation loop to substantially keep the sample node at the reference voltage when the voltage regulator is driven in sampling mode. Any variation of the sample node from the reference voltage will lead to a respective incrementing or decrementing input signal for the voltage supply thus leading to a correspondingly increased or reduced output voltage that is fed back to the capacitive voltage divider and the sample node.

According to another aspect also a voltage supply circuit for operating a memory device, in particular for operating a non-volatile memory is provided. This voltage supply circuit comprises a voltage supply and a voltage regulator as described above. Typically, the voltage supply comprises a charge pump to provide a well-defined long term stable high voltage output to enable configuration and writing of the memory device.

In still another aspect also a method of operating a voltage regulator in a reset mode and in a sampling mode is provided. Said voltage regulator comprises a capacitive voltage divider having a first capacitor and having a second capacitor in series with the first capacitor. The voltage regulator further comprises a comparator having an output connected to an input of a voltage supply. Said comparator further having a first input connected to a sampling node that is arranged between the first capacitor and the second capacitor. The comparator further has a second input connected to a reference voltage. The method of operating the voltage regulator comprises the steps of activating the sampling mode by connecting the capacitive voltage divider to an output of the voltage supply and activating the reset mode by connecting the sampling node to the reference voltage.

In effect, said method of operating the voltage regulator is implementable by a voltage regulator as described above. Hence, any reference made to the voltage regulator is therefore directly applicable and valid for the method of operating the voltage regulator and vice versa.

BRIEF DESCRIPTION OF THE DRAWINGS

In the following, an embodiment of the present invention is described in detail by making reference to the drawings, in which.

DETAILED DESCRIPTION

Figure 1:
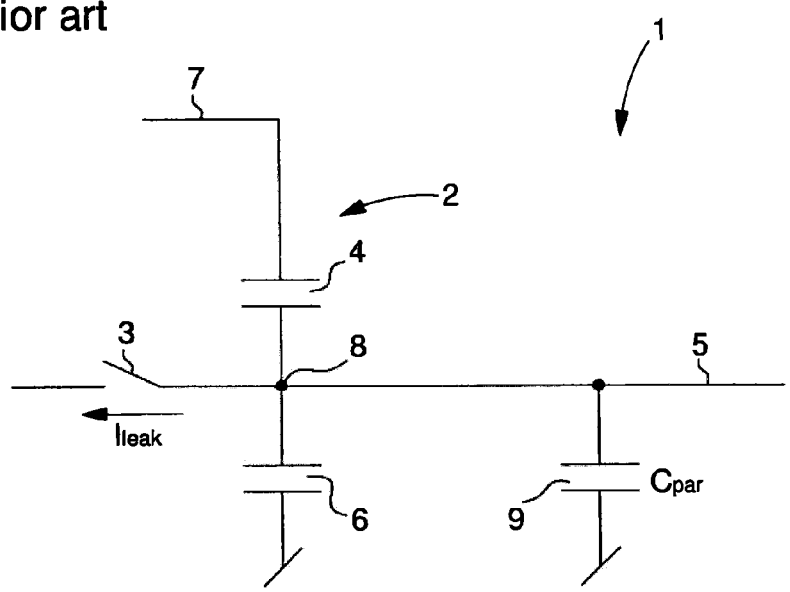
FIG. 1 shows a voltage regulator according to the prior art.
Figure 2:
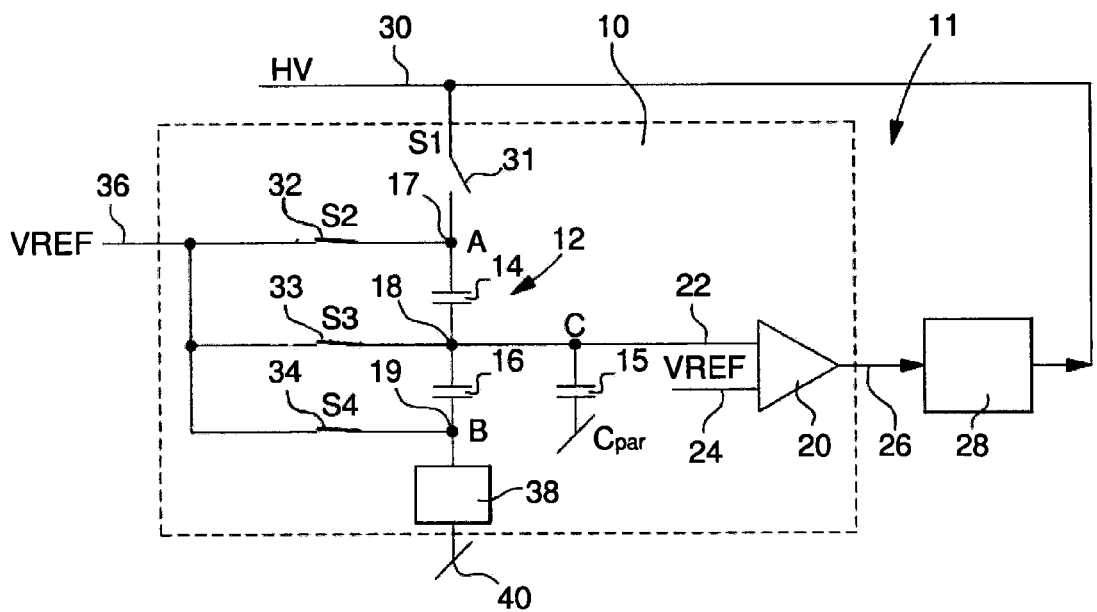
FIG. 2 shows a voltage regulator according to an embodiment of the present invention.

The voltage regulator 10 as indicated in the sketch of FIG. 2 comprises a capacitive voltage divider 12 having a first capacitor 14 and a second capacitor 16. First and second capacitors 14, 16 are arranged in series. Between first and second capacitors 14, 16 there is located an output of the capacitive voltage divider 12 denoted as a sampling node 18. The sampling node 18 is further connected with a first input 22 of a comparator 20 of the voltage regulator 10. Said comparator 20 further comprises a second input 24 that is connected to a reference voltage VREF. The reference voltage VREF can be of the order of 1.28 V. The output 26 of the comparator 20 is connected to an input of a voltage supply 28, which is typically implemented as a charge pump in order to provide a regulated and long term stable high voltage at a respective high voltage output 30. Said high voltage from the charge pump can be of the order of 15 V.

The capacitive divider 12 is connectable to the high voltage output 30 by means of a first switch 31. In operating or sampling mode, the voltage of the output 30 can be scaled down in accordance to the ratio of the capacitance of first and second capacitors 14, 16. As a consequence, the voltage at the sampling node 18 is reduced from the high voltage output 30 by a factor that is governed by the size of first and second capacitors 14, 16.

The voltage regulator 10 further comprises a driving circuit 38 by way of which the second capacitor 16 is connectable to ground voltage 40. Additionally, there are provided various switches 32, 33, 34 arranged in parallel, by way of which first and second capacitors can be selectively charged with the reference voltage VREF via a respective reference voltage input 36.

The voltage regulator 10 further comprises an inevitable parasitic capacity 15 effective at the first input 22 of the comparator 20.

The voltage regulator 10 as illustrated in FIG. 2 is in reset mode. Here, the first switch 31 is open and as a consequence, the capacitive voltage divider 12 is separated or disconnected from the high voltage output 30. Between the first switch 31 and the first capacitor 14, there is provided a first node 17 that is connected to the reference voltage input 36 via a second switch S2 32. In a similar way the sampling node 18 is also connected to the reference voltage input 36 via a third switch S3 33. Additionally, a second node 19 located between the second capacitor 16 and the driving circuit 38 is connected to the reference voltage input 36 via a fourth switch S4 34.

In the reset mode as indicated in FIG. 2, the switches 32, 33, 34 arranged in parallel are closed so that first and second capacitors 14, 16 are charged with the reference voltage VREF. Additionally, also the sampling node 18 is at reference voltage level. Consequently, the comparator 20 having equal voltage levels at first and second inputs, 22, 24, will be substantially ineffective.

Figure 3:
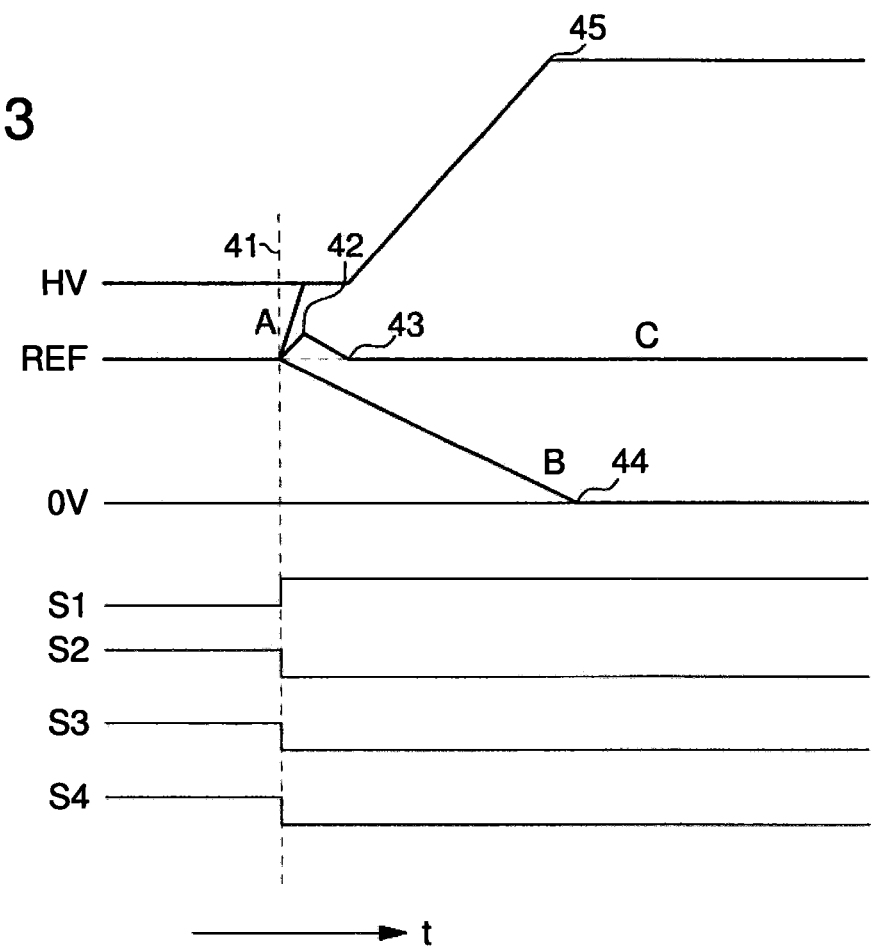
FIG. 3 is indicative of a voltage diagram of various nodes versus time when switching the voltage regulator from reset mode into sampling mode.

For switching the voltage regulator 10 from the reset mode into the sampling mode, the first switch 31 is closed while second, third and fourth switches 32, 33, 34 are opened or disconnected. This switching operation is indicated in FIG. 3 by the vertical line representing a switch point 41. By closing the first switch 31, the voltage A of the first node 17 experiences an abrupt rise in voltage to the output voltage HV of the voltage supply 28.

Due to the fixed ratio of the capacitance of first and second capacitors 14, 16, also the sampling node 18 experiences an initial voltage peak 42. Since this rise of the voltage C of the sampling node 18 is larger than the reference voltage VREF at the second input 24 of the comparator 20, the comparator 20 is either inactive or even generates a decrementing control signal to reduce the output of the voltage supply 28. When implemented as a charge pump, the voltage supply 28 is simply switched off as long as the voltage C of the sampling node 18 increases. Moreover, the charge pump 28 may remain switched off as long as the voltage C of the sampling node 18 and hence the voltage C of the first input 22 of the comparator 20 is larger than the reference voltage VREF present at the second input 24 of the comparator 20.

It is only when the voltage of the first input 22 reaches the reference voltage VREF that the comparator 20 is operable to generate incrementing input signals for the voltage supply 28.

Additionally, and when switching the voltage regulator 10 from reset mode into sampling mode, the driving circuit 38 starts to constantly decrement the voltage B of the second node 19. As indicated in FIG. 3, the voltage B slowly ramps down step by step depending on a pump clock of the charge pump until it reaches zero voltage or ground voltage at a point of time 44 after approximately 1 ms or less than 1 ms for example. By decrementing the voltage B at the second node 19 also a respective voltage C at the sampling node 18 can be reduced in a corresponding way from the peak 42 to the point 43, at which voltage C of the sampling node 18 returns to the reference voltage level VREF.

Further reducing the voltage B of the second node 19 by means of the driving circuit 38 would generally lead to a respective voltage level drop at the sampling node 18 as well. But since the feedback loop 11 formed by the comparator 20, the voltage supply 28 and the first capacitor 14 serves to keep the voltage C at the reference voltage level VREF, the voltage supply 28 is operable to increment or to increase the voltage of the output 30. Consequently, the voltage A at the first node 17 and hence the output voltage of the voltage supply 28 ramps up as indicated in FIG. 3 until it reaches a steady state 45 at a well-defined voltage level.

In sampling mode the third switch S3 33 experiences to both sides the reference voltage VREF. Consequently, a voltage drop across the switch 33 is almost negligible, a respective leakage current and a respective voltage drift is substantially eliminated.

Additionally, since the voltage C of the sampling node 18 is kept substantially constant almost during the complete sampling procedure, a negative impact of any parasitic capacitance 15 can be compensated or is of almost no effect.

In effect, the dimension of the first and second capacitors 14, 16 can be substantially reduced thus enabling a rather compact and cost efficient design of the voltage regulator 10. Furthermore it can be provided more than two capacitors for the capacitive voltage divider with respect to the sampling node 18. Said capacitive voltage divider can be composed of capacitors, which can be connected in series or in parallel to define for example a first capacitor and a second capacitor.

It is to be noted that the above-mentioned voltage regulator is described for a positive regulation, but it can be envisaged to make said voltage regulator for a negative regulation, for example between 0 V and −15 V at output of the charge pump, or other voltage range.

What is claimed is:

1. A voltage regulator operable in a reset mode and in a sampling mode, the voltage regulator comprising:
   a capacitive voltage divider having a first capacitor and a second capacitor in series with the first capacitor, the capacitive voltage divider being connectable to an output of a voltage supply to activate the sampling mode,
   a comparator having an output connected to an input of the voltage supply, the comparator further having a first input connected to a sampling node arranged between the first capacitor and the second capacitor and the comparator, and the comparator having a second input connected to a reference voltage,
   wherein switches are arranged in parallel, by way of which the first and second capacitors and the sampling node are connectable to the reference voltage for activating the reset mode,
   wherein the first capacitor is connectable to the output of the voltage supply via a first switch,
   wherein the second capacitor is connected to ground via a driving circuit,
   wherein a first node between the first capacitor and the output of the voltage supply is connectable to the reference voltage via a second switch, and
   wherein the sampling node is connectable with the reference voltage via a third switch.

2. The voltage regulator according to claim 1, wherein the sampling node is disconnectable from the reference voltage to activate the sampling mode.

3. The voltage regulator according to claim 1, wherein the capacitive voltage divider and/or the first capacitor is/are disconnectable from the output of the voltage supply to activate the reset mode.

4. The voltage regulator according to claim 1, wherein a second node is arranged between the second capacitor and the driving circuit.

5. The voltage regulator according to claim 4, wherein the second node is connectable to the reference voltage via a fourth switch.

6. The voltage regulator according to claim 5, wherein the second, third and fourth switches are closeable while the first switch is openable for activating the reset mode.

7. The voltage regulator according to claim 5, wherein the second, third and fourth switches are openable while the first switch is closeable for activating the sampling mode.

8. The voltage regulator according to claim 4, wherein when in the sampling mode, the driving circuit is operable to decrement the voltage of the second node in a controlled way towards ground voltage level.

9. The voltage regulator according to claim 1, wherein the voltage supply, the output of the voltage supply, the first capacitor, the sampling node and the comparator form a feedback loop to substantially keep the sampling node at the reference voltage when in the sampling mode.

10. A voltage supply circuit for operating a memory device, comprising a voltage supply and a voltage regulator according to claim 1.

11. A method of operating a voltage regulator in a reset mode and in a sampling mode, wherein the voltage regulator comprises:
   a capacitive voltage divider having a first capacitor and a second capacitor in series with the first capacitor,
   a comparator having an output connected to an input of a voltage supply, the comparator further having a first input connected to a sampling node arranged between the first capacitor and the second capacitor, and the comparator having a second input connected to a reference voltage, wherein the method comprises:
   activating the sampling mode by connecting the capacitive voltage divider to an output of the voltage supply,
   activating the reset mode by connecting the first and second capacitors and the sampling node by way of switches arranged in parallel to the reference voltage, for which the first capacitor is connectable to the output of the voltage supply via a first switch, the second capacitor is connected to ground via a driving circuit, a first node between the first capacitor and the output of the voltage supply is connectable to the reference voltage via a second switch, and the sampling node is connectable with the reference voltage via a third switch.

* * * * *